(12) United States Patent
Huang et al.

(10) Patent No.: US 9,220,171 B2
(45) Date of Patent: Dec. 22, 2015

(54) METHOD OF FABRICATING HOUSING, HOUSING, AND ELECTRONIC APPARATUS

(71) Applicant: HTC Corporation, Taoyuan County (TW)

(72) Inventors: Che-Hung Huang, Taoyuan County (TW); Chin-Chung Shih, Taoyuan County (TW)

(73) Assignee: HTC Corporation, Taoyuan (TW)

( * ) Notice: Subject to any disclaimer, the term of this patent is extended or adjusted under 35 U.S.C. 154(b) by 55 days.

(21) Appl. No.: 14/153,082

(22) Filed: Jan. 13, 2014

(65) Prior Publication Data

US 2015/0201506 A1 Jul. 16, 2015

(51) Int. Cl.

| | |
|---|---|
| *H05K 5/00* | (2006.01) |
| *B29C 51/14* | (2006.01) |
| *B29K 105/00* | (2006.01) |
| *B29K 705/00* | (2006.01) |
| *B29K 101/12* | (2006.01) |
| *B29C 51/34* | (2006.01) |
| *B29C 51/30* | (2006.01) |
| *B29C 37/00* | (2006.01) |
| *B29C 51/20* | (2006.01) |
| *B29C 51/12* | (2006.01) |

(52) U.S. Cl.
CPC .............. *H05K 5/0017* (2013.01); *B29C 51/14* (2013.01); *B29C 37/0003* (2013.01); *B29C 51/12* (2013.01); *B29C 51/20* (2013.01); *B29C 51/306* (2013.01); *B29C 51/34* (2013.01); *B29C 51/343* (2013.01); *B29K 2101/12* (2013.01); *B29K 2105/256* (2013.01); *B29K 2705/00* (2013.01); *B29K 2995/0016* (2013.01); *H05K 5/00* (2013.01)

(58) Field of Classification Search
CPC ........ H05K 5/00; H05K 5/0017; B29C 51/14; B29C 51/34; B29C 51/343; B29C 51/306; B29C 51/003; B29C 51/20; B29C 51/12; B29C 37/0003; B29K 2995/0016; B29K 2105/256; B29K 2705/00; B29K 2101/12
USPC ......................................................... 156/245
See application file for complete search history.

(56) References Cited

U.S. PATENT DOCUMENTS

| | | | |
|---|---|---|---|
| 6,092,858 A | 7/2000 | Bolwell | |
| 6,742,237 B2 * | 6/2004 | Chang | ........................ 29/469.5 |
| 2013/0243983 A1 * | 9/2013 | Omote et al. | ................ 428/35.6 |

FOREIGN PATENT DOCUMENTS

| | | |
|---|---|---|
| CN | 103434119 A | 12/2013 |
| JP | 60-23713 B2 | 6/1985 |

OTHER PUBLICATIONS

Corresponding Taiwanese Notice of Allowance that these art references were cited on Oct. 28, 2015.

* cited by examiner

*Primary Examiner* — Philip Tucker
*Assistant Examiner* — Vicki Wu
(74) *Attorney, Agent, or Firm* — CKC & Partners Co., Ltd.

(57) ABSTRACT

A method of fabricating housing includes steps of: providing a sheet; providing a mold including a first core and a second core, in which the first core substantially extends along a plane, and the second core is adjacent to the first core; pressing the sheet to the mold to make the sheet attach to the second core, in which the second core is fixed to the sheet; and moving the sheet away from the first core along a vertical direction perpendicular to the plane to separate the second core and the first core so as to make the second core become an internal member, in which a housing is formed of the sheet and the internal member.

13 Claims, 9 Drawing Sheets

METHOD OF FABRICATING HOUSING, HOUSING, AND ELECTRONIC APPARATUS

BACKGROUND

1. Technical Field

The present disclosure relates to a method of fabricating a housing, a housing, and an electronic apparatus.

2. Description of Related Art

Owing to features of lightweight, being easy to manufacture, and low costs, plastics has been widely used in processes of injection molding or thermoforming. After the melt plastics is injected in the mold of which the cavity has a special shape with predetermined pressures and temperatures, the plastics is formed to be a housing having the special shape of the cavity.

As to a conventional smart phone or a tablet computer, the housing usually includes a front cover and a back cover, and the front cover has an assembly opening configured to assemble a display module (or a touch module). In general, the area of the assembly opening is smaller than the area of the front cover or the back cover. Therefore, in order to solve the problem that the housing cannot be separated from the mold during fabricating due to interference, the front cover and the back cover must be fabricated individually.

However, the individually fabricated front and back covers need two different molds, so the costs of the molds cannot be saved. In addition, there must exist a tolerance between the front and back covers that are fabricated by different molds, so filth is easily accumulated at the gap between the front and back covers.

Accordingly, how to fabricate a one-pieced housing by a single mold to replace the two-pieced housing assembled by the front cover and the back cover becomes an important issue to be solved by those in the industry.

SUMMARY

The disclosure provides a method of fabricating a housing. The method includes steps of: providing a sheet; providing a mold, in which the mold comprises a first core and a second core, the first core substantially extends along a plane, and the second core is adjacent to the first core; pressing the sheet to the mold to make the sheet attach to the second core, in which the sheet and the second core are fixed with each other; and moving the pressed sheet away from the first core along a vertical direction perpendicular to the plane and separating the second core from the first core to make the second core become an internal member, in which the sheet and the internal member form the housing.

The disclosure further provides a housing. The housing includes a back cover, a hook structure, and an internal member. The back cover is substantially extended along a plane. The hook structure is integrally connected to an edge of the back cover. A groove is formed of the hook structure. The internal member is fixed within the groove.

Accordingly, by fabricating the second core around the first core in advance, the hook structure can be formed from the heated and pressed sheet according to the method of fabricating the housing. Because the second core is engaged with the hook structure and protrudes out of the groove formed by the hook structure, the heated and pressed sheet will be separated from the first core with the second core when demolding to prevent the problem that the sheet cannot be separated from the mold due to the interference with the first core. Hence, the second core engaged with the groove and the heated and pressed sheet form the housing of the disclosure, and the second core serves as the internal member in the housing and can be further machined to form a needed structure (e.g. a hook or a trough). Furthermore, in order to improve the influence (e.g., a step of the sheet is generated at the location corresponding to the junction of the first core and the second core) caused by the situation that the first core and the second core are made from different materials when the sheet is heated and pressed, in another embodiment of the method of fabricating housing of the disclosure, the third core, of which the material is the same to the second core, that is connected to the second core is provided, and the sheet is actually heated and pressed by the second core and the third core. When the heated and pressed sheet separates from the mold, the sheet is separated with the second core and the third core from the first core, so to prevent the problem that the second core cannot be separated from the mold due to the interference with the first care. Finally, the housing can be obtained by removing the third core from the second core.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
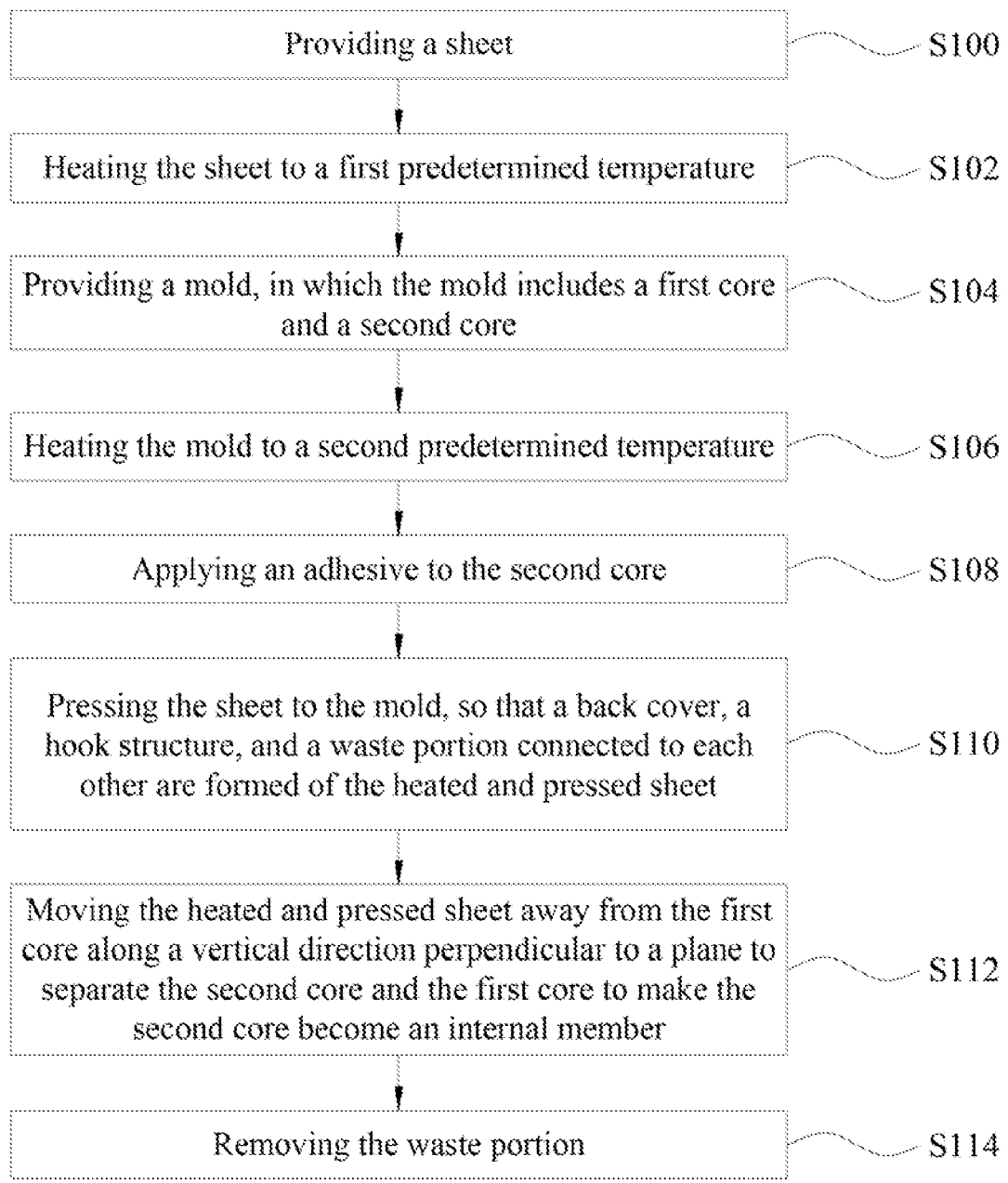
FIG. 1 is a flow chart of a method of fabricating housing according to an embodiment of the disclosure.

Reference will now be made in detail to the present embodiments of the disclosure, examples of which are illustrated in the accompanying drawings. Wherever possible, the same reference numbers are used in the drawings and the description to refer to the same or like parts.

Figure 2:
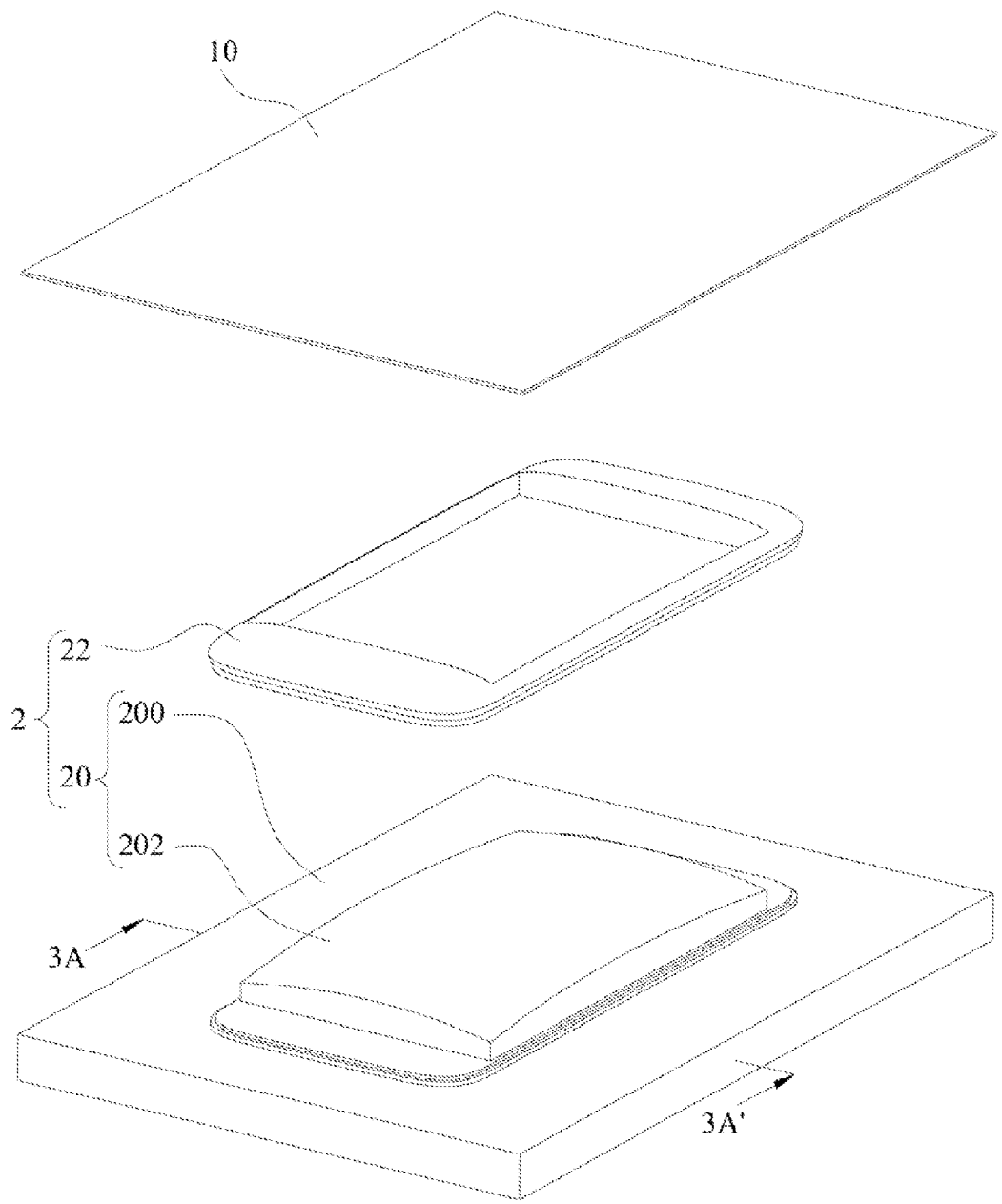
FIG. 2 is an exploded view of a sheet and a mold according to an embodiment of the disclosure.
Figure 3A:
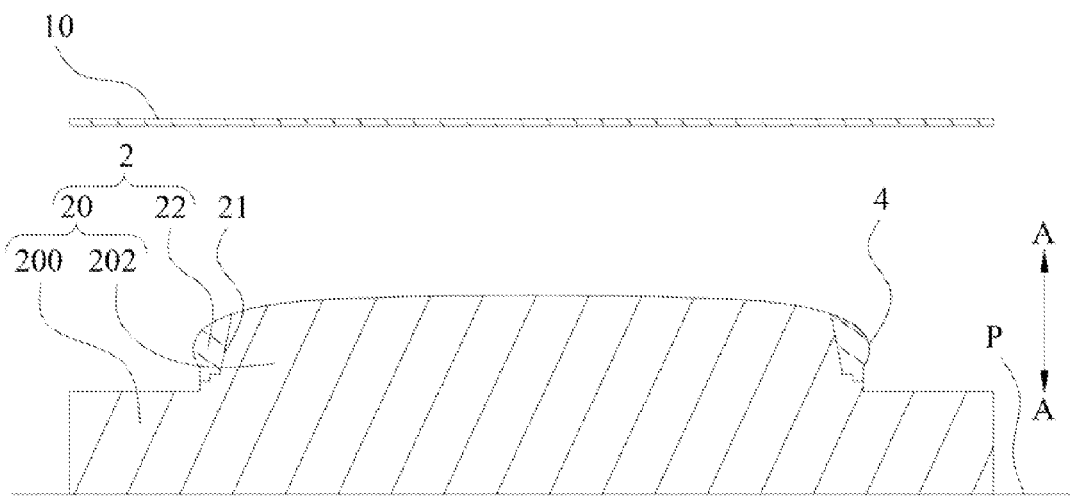
FIG. 3A is a cross-sectional view of the sheet and the mold in FIG. 2 along line 3A-3A'.

Referring to FIG. 1, FIG. 2 and FIG. 3A, FIG. 1 is a flow chart of a method of fabricating a housing according to an embodiment of the disclosure. FIG. 2 is an exploded view of a sheet 10 and a mold 2 according to an embodiment of the disclosure. FIG. 3A is a cross-sectional view of the sheet 10 and the mold 2 in FIG. 2 along line 3A-3A'.

As shown in FIG. 1 to FIG. 3A, the method of fabricating the housing includes steps S100~S108 which are described in detail below.

Step S100: providing a sheet 100.

In the embodiment of the disclosure, the material of the sheet 10 includes thermoplastics, so the sheet 10 has features of being softened by heated and hardened by cooled. For example, the material of the sheet 10 can include at least one of Polyethylene (PE), Polypropylene (PP), Polystyrene (PS), Polymethyl methacrylate (PMMA), Polyvinyl Chloride (PVC), Nylon, Polycarbonate (PC), Polyurethane (PU), Polytetrafluoroethylene (PTFE), and Polyethylene terephthalate (PET), but the disclosure is not limited in this regard.

Step S102: heating the sheet 10 to a first predetermined temperature.

In the embodiment of the disclosure, the first predetermined temperature is between 300° C. and 500° C. but the disclosure is not limited in this regard. In practice, the temperature at which the sheet 10 can be softened to easily deform or machine can be the first predetermined temperature for heating the sheet 10.

Step S104: providing the mold 2, in which the mold 2 includes a first core 20 and a second core 22.

In the embodiment of the disclosure, the first core 20 of the mold 2 substantially extends along a plane P. The second core 22 of the mold 2 is adjacent to the first core 20.

Furthermore, the first core 20 of the mold 2 includes a base portion 200 and a platform portion 202. The platform portion 202 of the first core 20 is located on the base portion 200. The second core 22 of the mold 2 is disposed around the platform portion 202 of the first core 20 (as shown in FIG. 2 and FIG. 3A).

Step S106: heating the mold 2 to a second predetermined temperature.

It should be pointed out that the first predetermined temperature for heating the sheet 10 is higher than the second predetermined temperature for heating the mold 2. The purpose of heating the mold 2 to the second predetermined temperature is to reduce the difference of temperature between the sheet 10 and the mold 2, so as to prevent the sheet 10 from unexpected shrinkage because of rapidly cooling while contacting the mold 2.

In the embodiment of the disclosure, the material of the first core 20 of the mold 2 includes metal, the material of the second core 22 of the mold 2 includes heat-resistant plastics, but the disclosure is not limited in this regard. In practice, the material of the first core 20 can be hard, heat-resistant, and impact-resistant, and the material of the second core 22 can be heat-resistant and easy for secondary processing.

In the embodiment of the disclosure, the second predetermined temperature is between 130° C. and 150° C., but the disclosure is not limited in this regard. In practice, the temperature at which heat of the softened sheet 10 can be preserved can be the second predetermined temperature for heating the sheet 10.

Step S108: applying an adhesive 4 to the second core 22.

Figure 3B:
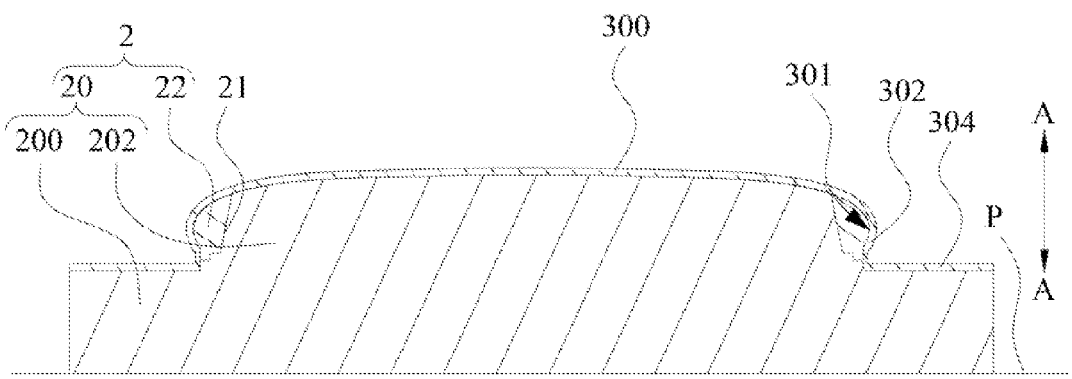
FIG. 3B is another cross-sectional view of FIG. 3A, in which the sheet heated and pressed.
Figure 3C:
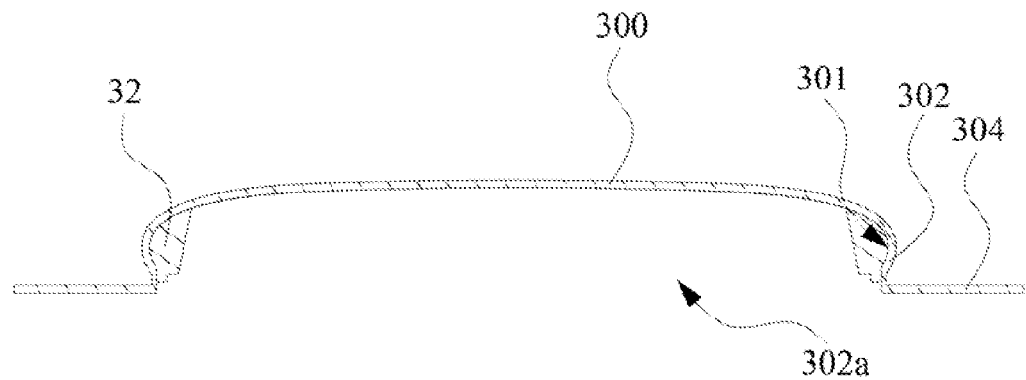
FIG. 3C is another cross-sectional view of FIG. 3A, in which the heated and pressed sheet and a second core separate from a first core.
Figure 3D:
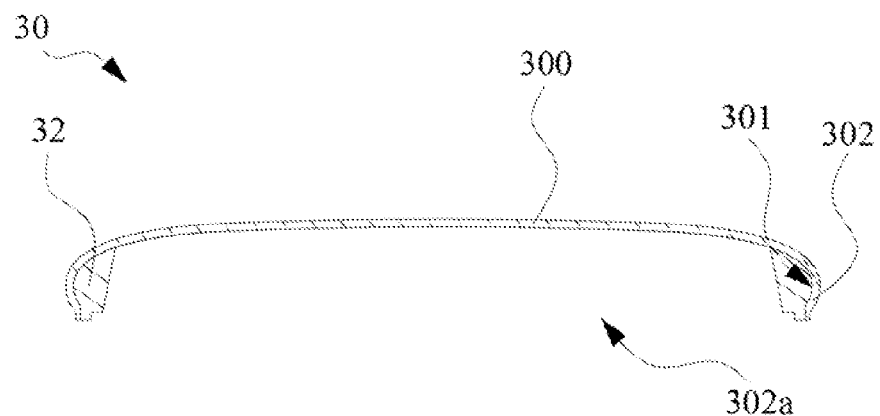
FIG. 3D is another cross-sectional view of FIG. 3A, in which a waste portion is removed from the heated and pressed sheet.

Referring to FIG. 3B, FIG. 3C and FIG. 3D. FIG. 3B is another cross-sectional view of FIG. 3A, in which the sheet 10 is formed by heating and pressing. FIG. 3C is another cross-sectional view of FIG. 3A, in which the heated and pressed sheet 10 and the second core 22 are separated from the first core 20. FIG. 3D is another cross-sectional view of FIG. 3A, in which a waste portion 304 is removed from the heated and pressed sheet 10.

As shown in FIG. 1 to FIG. 3B, the method of fabricating housing further includes step S110.

Step S110: pressing the sheet 10 to the mold 2, so that a back cover 300, a hook structure 302, and a waste portion 304 connected to each other are formed of the heated and pressed sheet 10.

In the present embodiment, the most part of the back cover 300 is substantially formed by the first core 20 of the mold 2, and the hook structure 302 is formed by the second core 22 of the mold 2. In addition, the hook structure 302 is bended along a vertical direction A perpendicular to the plane P to form a groove 301, and the second core 22 of the mold 2 is fixed within the groove 301.

In step S108, the adhesive 4 is applied to the second core 22 of the mold 2 to make second core 22 adhere to the hook structure 302 after the sheet 10 is heated and pressed.

However, the disclosure is not limited in this regard. In another embodiment, step S108' (Not shown in Figure) can replace the foregoing step S108.

Step S108': applying the adhesive 4 to the sheet 10.

By applying the adhesive 4 to the sheet 10, the second core 22 can also be adhered to the hook structure 302 by the adhesive 4 after the sheet 10 is heated and pressed, in which the approach of applying the adhesive 4 to the sheet 10 includes printing the adhesive 4 on the sheet 10 first.

As shown in FIG. 3B, the back cover 300 is integrally connected to the hook structure 302as. The hook structure 302 is bended along the vertical direction A to form the groove 301.

Hence, the back cover 300 is formed by the first core 20 of the mold 2, and the hook structure 302 is formed by the second core 22 of the mold 2. The hook structure 302 is connected between the back cover 300 and the waste portion 304, and the waste portion 304 is pressed onto the base portion 200 of the first core 20.

It should be pointed out that the second core 22 of the mold 2 originally is disposed around the platform portion 202 of the first core 20, so that the hook structure 302 is around the back cover 300 and connected thereto after the sheet 10 is heated and pressed, and the groove 301 is ring-shaped.

As shown in FIG. 1 and FIG. 3C, in the present embodiment, the method of fabricating the housing further includes step S112.

Step S112: moving the heated and pressed sheet 10 away from the first core 20 along the vertical direction A perpendicular to the plane P to separate the second core 22 and the first core 20 to make the second core 22 become an internal member 32.

In practice, a contact surface 21 is formed between the first core 20 and the second core 22. The contact surface 21 is inclined toward the center of the first core 20. Hence, with the inclined direction of connecting surface 21, no interference will occur between the second core 22 of mold 2 and the first core 20 when the heated and pressed sheet 10 is separated from the first core 20 along the vertical direction A (such as demolding). In other words, if there is no interference occurred between the second core 22 of mold 2 and the first core 20 during the heated and pressed sheet 10 is demolding, the inclined direction of the contact surface 21 meets the design principle of the invention.

Finally, as shown in FIG. 1, FIG. 3C, and FIG. 3D, the method of fabricating the housing further includes step S114.

Step S114: removing the waste portion 304.

In the embodiment, after the waste portion 304 is removed from the heated and pressed sheet 10, a housing 30 provided from the method of fabricating housing of the invention is formed of the remaining back cover 300, hook structure 302, and internal member 32. Thereby, the internal member 32 that is fixed within the groove 301 can be further machined to form a needed structure (e.g., a hook or a trough).

It should be pointed out that both of the first core 20 and the second core 22 of the mold 2 contact the sheet 10 when pressing the sheet 10, if the first core 20 and the second core 22 are made from different materials, a step of the sheet 10 may be generated at the location corresponding to the junction (i.e., the contact surface 21) of the first core 20 and the second core 22. The reason of the occurrence of step is that the first core 20 and the second core 22 produced by different materials have different degrees of thermal expansion when the mold 2 is heated to the second predetermined temperature (step S106).

For further improvement to solve this problem, the invention further provides another embodiment of the method of fabricating housing.

Figure 4:
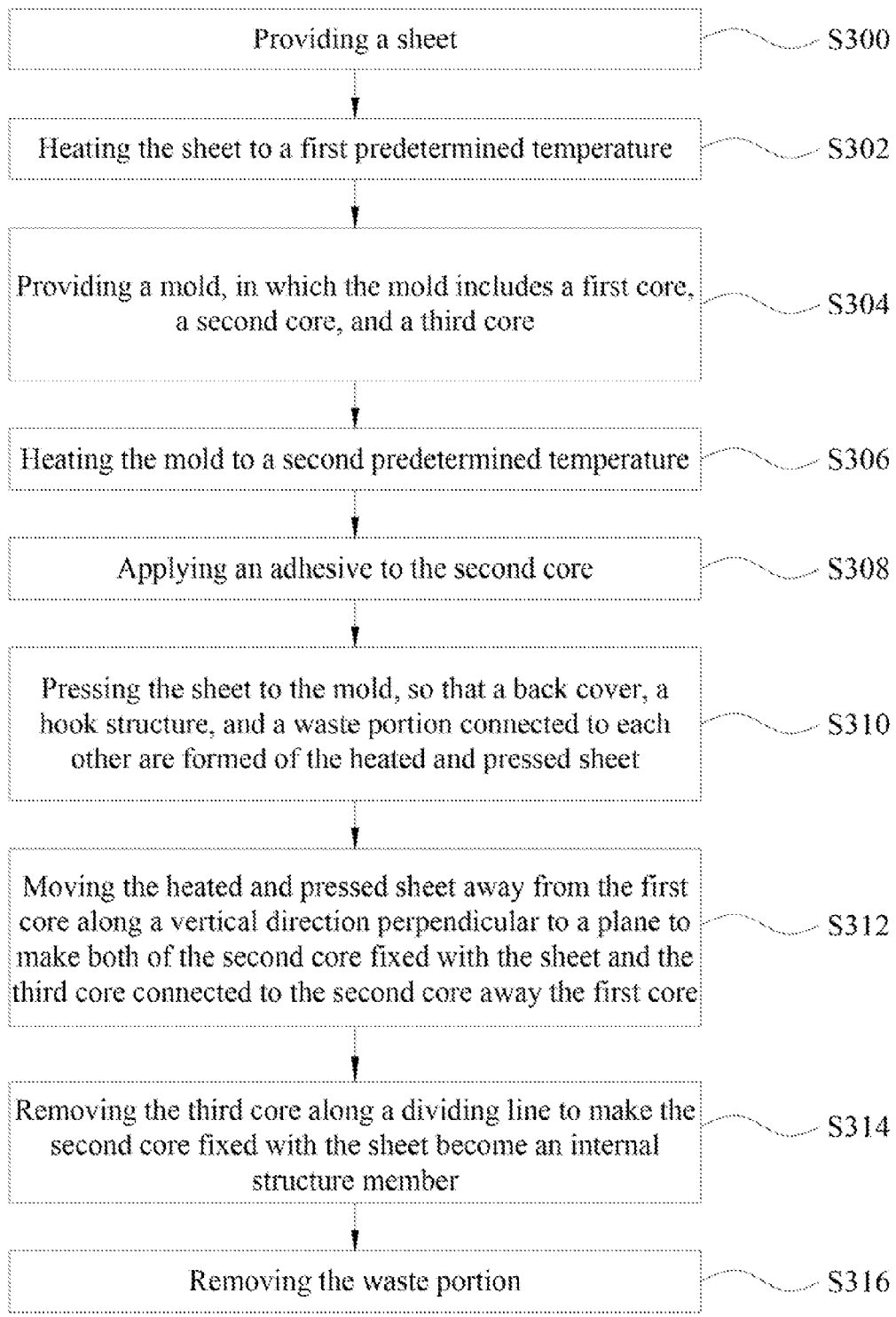
FIG. 4 is a flow chart of a method of fabricating housing according to another embodiment of the disclosure.
Figure 5:
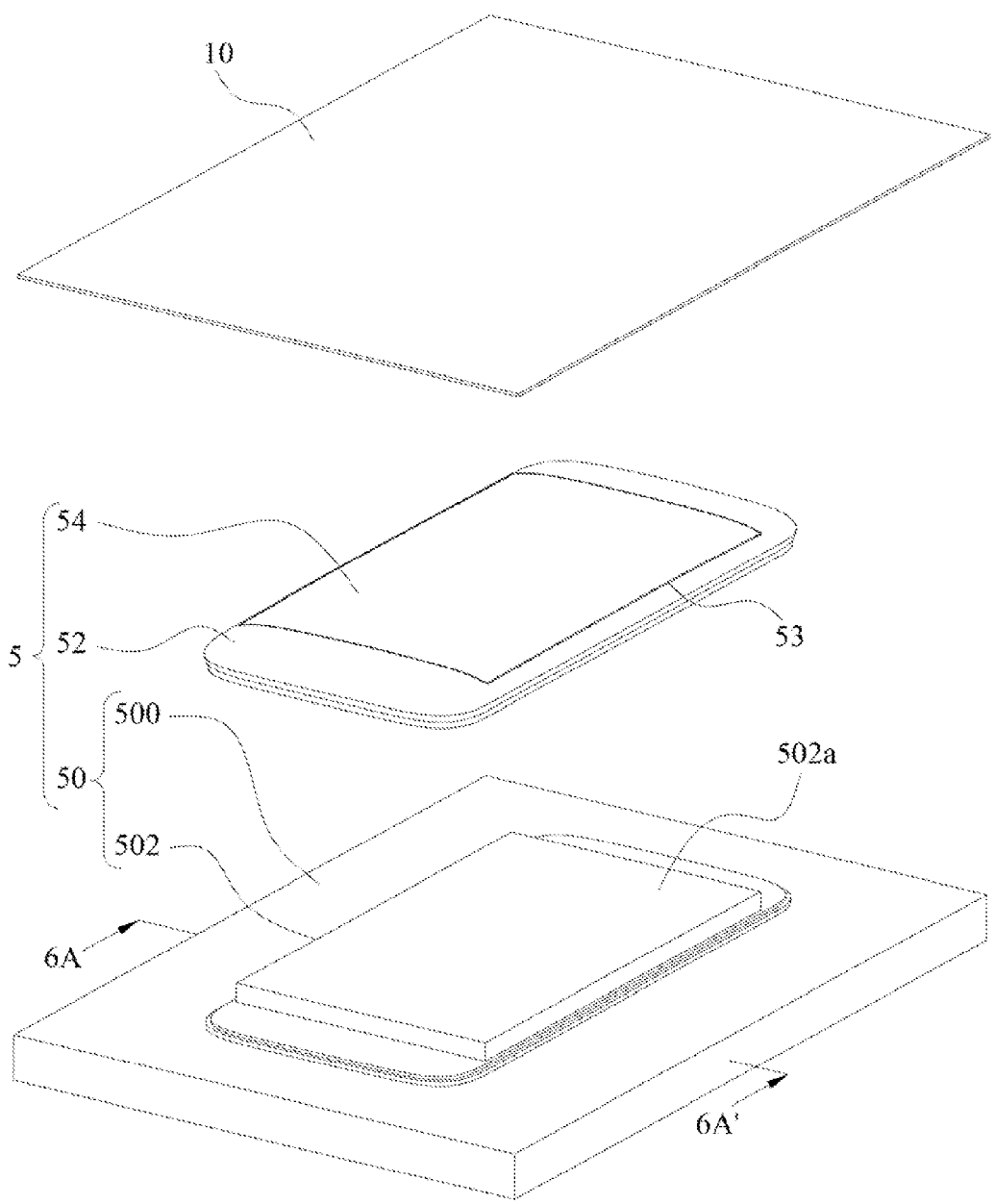
FIG. 5 is an exploded view of a sheet and a mold according to another embodiment of the disclosure.
Figure 6A:
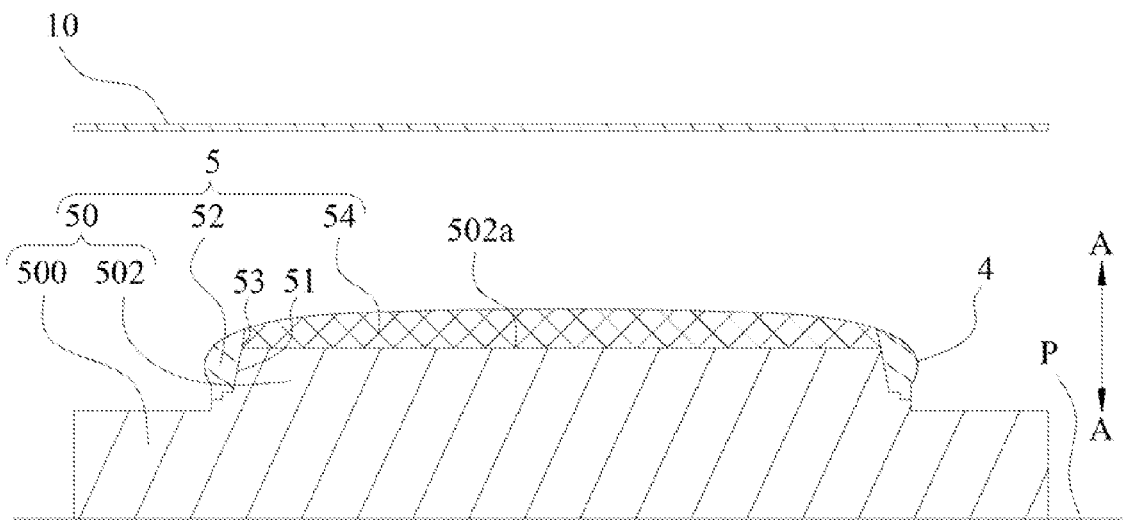
FIG. 6A is a cross-sectional view of the sheet and the mold in FIG. 5 along line 6A-6A.

Referring to FIG. 4, FIG. 5 and FIG. 6A. FIG. 4 is a flow chart of a method of fabricating a housing according to another embodiment of the invention. FIG. 5 is an exploded view of a sheet 10 and a mold 5 according to another embodiment of the invention. FIG. 6A is a cross-sectional view of the sheet 10 and the mold 5 in FIG. 5 along line 6A-6A'.

As shown in FIG. 4 to FIG. 6A, the method of fabricating the housing includes steps S300~S310 which are described in detail below.

Step S300: providing a sheet 10.

Step S302: heating the sheet 10 to a first predetermined temperature.

Step S300 and step S302 of the embodiment are the same as step S100 and step S102 of the former embodiment respectively, so the related descriptions can be referred correspondingly and they are not repeated again here.

Step S304: providing a mold 5, in which the mold 5 includes a first core 50, a second core 52, and a third core 54.

In the present embodiment, the first core 50 of the mold 5 substantially extends along a plane P. The second core 52 of the mold 5 is adjacent to the first core 50.

Furthermore, the first core 50 of the mold 5 includes a base portion 500 and a platform portion 502. The platform portion 502 of the first core 50 is located on the base portion 500 and has a top surface 502a. The second core 52 of the mold 5 is disposed around the platform portion 502 of the first core 50 (as shown in FIG. 5 and FIG. 6A). The third core 54 of the mold 5 is disposed on the top surface 502a of the platform portion 502 and connected to an inner edge of the second core 52.

Step S306: heating the mold 5 to a second predetermined temperature.

Step S308: applying an adhesive 4 to the second core 52.

In the present embodiment, step S306 and step S308 of the embodiment are the same as step S106 and step S108 of the former embodiment respectively, so the related descriptions can be referred correspondingly and they are not repeated again here.

In the present embodiment, the material of the first core 50 of the mold 5 includes metal, the materials of the second core 52 and the third core 54 of the mold 2 include heat-resistant plastics, but the invention is not limited in this regard.

Figure 6B:
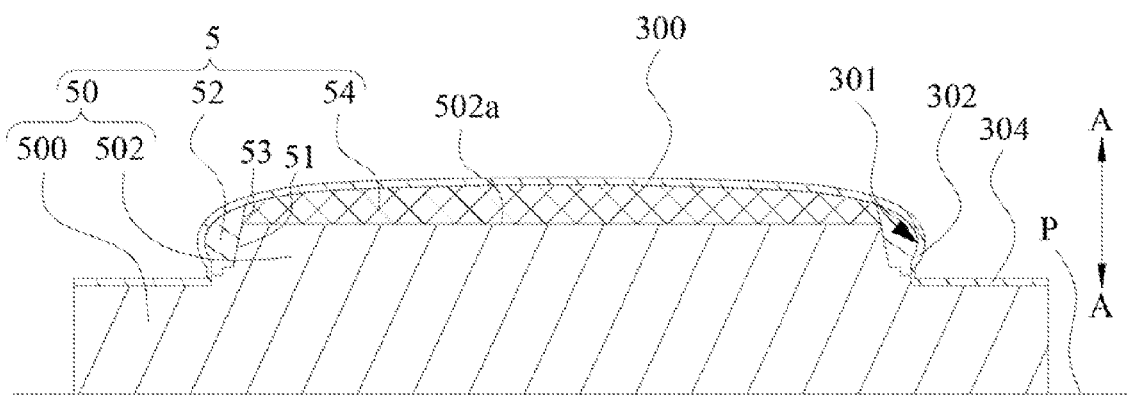
FIG. 6B is another cross-sectional view of FIG. 6A, in which the sheet is heated and pressed.

FIG. 6B is another cross-sectional view of FIG. 6A, in which the sheet 10 is heated and pressed.

As shown in FIG. 4 and FIG. 6B, the method of fabricating the housing further includes step S310.

Step S310: pressing the sheet 10 to the mold 5, so that a back cover 300, a hook structure 302, and a waste portion 304 connected to each other are formed of the heated and pressed sheet 10.

In the present embodiment, the most part of the back cover 300 is substantially formed by the third core 54 of the mold 5, and the hook structure 302 is formed by the second core 52 of the mold 5. In addition, the hook structure 302 is bended along a vertical direction A perpendicular to the plane P to form a groove 301, and the second core 52 of the mold 5 is fixed within the groove 301.

As shown in FIG. 6B, the back cover 300 is integrally connected to the hook structure 302. The hook structure 302 is bended along the vertical direction A to form the groove 301.

Hence, the back cover 300 is formed by the third core 54 of the mold 5, and the hook structure 302 is formed by the second core 52 of the mold 5. The hook structure 302 is connected between the back cover 300 and the waste portion 304, and the waste portion 304 is pressed' onto the base portion 500 of the first core 50.

It should be pointed out that the second core 52 of the mold 5 originally is disposed around the platform portion 502 of the first core 50, and the third core 54 is disposed on the top surface 502a of the platform portion 502 adjacent to the inner edge of the second core 52, so that the hook structure 302 (formed by the second core 52) is connected around the back cover 300 (formed by the third core 54) after the sheet 10 is heated and pressed, and the groove 301 is ring-shaped.

Figure 6C:
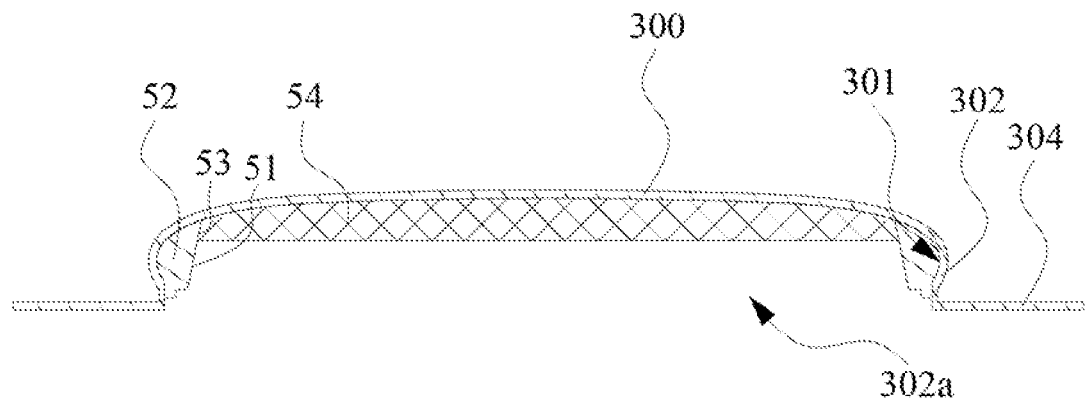
FIG. 6C is another cross-sectional view of FIG. 6A, in which the heated and pressed sheet, a second core, and a third core separate from a first core.
Figure 6D:
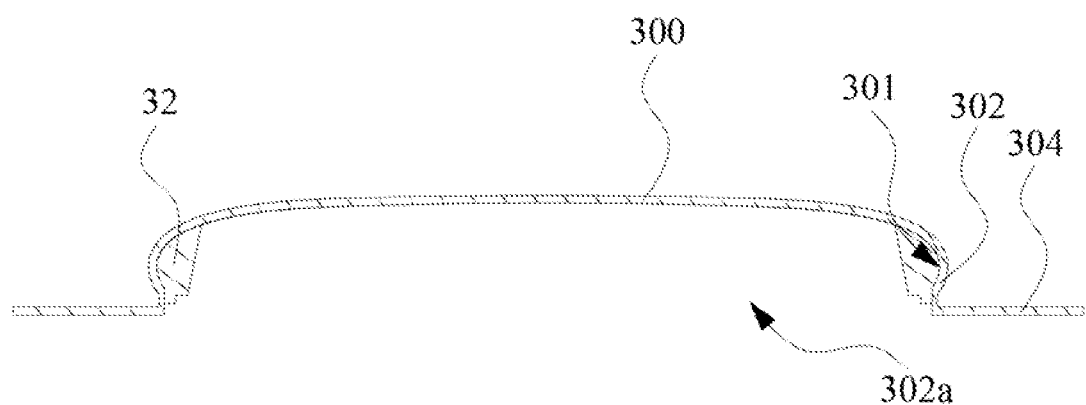
FIG. 6D is another cross-sectional view of FIG. 6A, in which the third core is removed.

Referring to FIG. 6C and FIG. 6D. FIG. 6C is another cross-sectional view of FIG. 6A, in which the heated and pressed sheet 10, the second core 52, and the third core 54 are separated from the first core 50. FIG. 6D is another cross-sectional view of FIG. 6A, in which the third core 54 is removed.

As shown in FIG. 4, FIG. 6C, and FIG. 6D, in the present embodiment, a dividing line 53 is formed between the second core 52 and the third core 54 of the mold 5. The method of fabricating the housing further includes steps S312-S314.

Step S312: moving the heated and pressed sheet 10 away from the first core 50 along a vertical direction A perpendicular to the plane P to make both of the second core 52 fixed with the sheet 10 (especially within the groove 301 of the sheet 10) and the third core 54 connected to the second core 52 away from the first core 50.

Step S314: removing the third core 54 along the dividing line 53 to make the second core 52 fixed with the sheet 10 (especially within the groove 301 of the sheet 10) become an internal member 32.

It should be pointed out that the back cover 300 and the hook structure 302 are formed by the third core 54 and the second core 52 of the mold 5, so if the second core 52 and the third core 54 are made from the same material, there will be no step of the heated and pressed sheet 10 generated at the location corresponding to the junction (i.e., the dividing line 53) of the second core 52 and the third core 54. The reason that no step will be generated is that the second core 52 and the third core 54 have the same degree of thermal expansion when the mold 5 is heated to the second predetermined temperature (step S306).

Finally, as shown in FIG. 3D and FIG. 4, in the present embodiment, the method of fabricating the housing further includes step S316.

Step S316: removing the waste portion 304.

In the embodiment, after the waste portion 304 is removed from the heated and pressed sheet 10, a housing 30 provided from the method of fabricating the housing of the invention is formed of the remaining back cover 300, hook structure 302, and internal member 32. Therefore, the internal member 32 fixed within the groove 301 can be further machined to form a needed structure (e.g., a hook or a trough).

Figure 7:
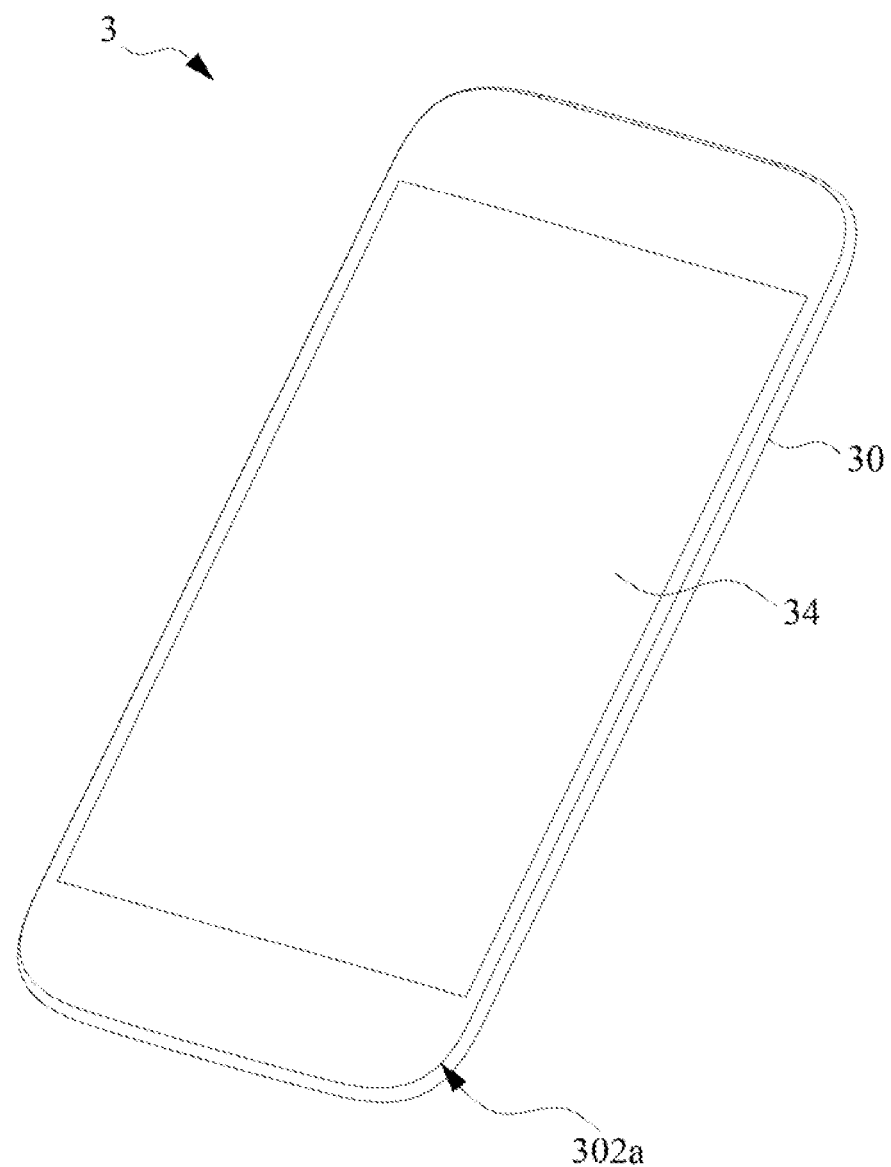
FIG. 7 is a perspective view of an electronic apparatus according to an embodiment of the disclosure.
Figure 8:
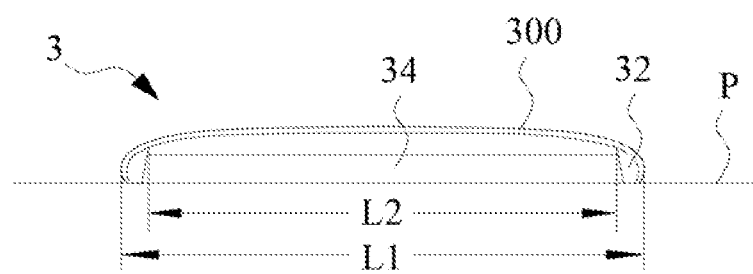
FIG. 8 is a side view of the electronic apparatus in FIG. 7.

Referring to FIG. 7 and FIG. 8. FIG. 7 is a perspective view of an electronic apparatus 3 according to an embodiment of the invention. FIG. 8 is a side view of the electronic apparatus 3 in FIG. 7.

As shown in FIG. 7 and FIG. 8, the electronic apparatus 3 includes the housing 30 formed by the forgoing methods and a display module 34. The hook structure 302 of the housing 30 has an assembly opening 302a, and the assembly opening 302a assembles the display module 34. In particular, an orthographic projection of the housing 30 of electronic apparatus 3 on the plane P covers an orthographic projection of the inner edge of the internal member 32 on the plane P. For example, as shown in FIG. 8, the orthographic projection of the housing 30 of electronic apparatus 3 on the plane P has a first projection width L1 the orthographic projection of the inner edge of the internal member 32 on the plane P has a second projection width L2, and the first projection width L1 is larger than the second projection width L2.

According to the foregoing recitations of the embodiments of the invention, it can be seen that by fabricating the second core around the first core in advance, the hook structure can be formed on the heated and pressed sheet according to the method of fabricating the housing. Because the second core is engaged with the hook structure and protrudes out of the groove formed by the hook structure, the heated and pressed sheet while demolding can be separated from the first core, to prevent the problem that the sheet cannot be separated from the mold due to the interference with the first core. Hence, the second core engaged with the groove and the heated and pressed sheet form the housing of the invention, and the second core serves as the internal member in the housing and can be further machined to form a needed structure (e.g., a hook or a trough). Furthermore, in order to improve the influence (e.g., a step of the sheet is generated at the location corresponding to the junction of the first core and the second core) caused by the situation that the first core and the second core are made from different materials when the sheet is heated and pressed, in another embodiment of the method of fabricating the housing of the invention, the third core which the material is the same and adjacent to the second core is provided, and the sheet is actually formed by the second core and the third core. When the heated and pressed sheet is demolding, the sheet can be separated from the first core with the second core and the third core to prevent the problem that the second core cannot be separated from the mold due to the interference with the first core. Finally, the housing can be obtained by removing the third core from the second core.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A method of fabricating a housing, comprising:
   providing a sheet;
   providing a mold, wherein the mold comprises a first core and a second core, the first core substantially extends along a plane, and the second core is adjacent to the first core;
   pressing the sheet to the mold to make the sheet attach to the second core, wherein the sheet and the second core are fixed to each other, wherein the step of pressing the sheet to the mold to make the sheet attach to the second core comprises:
      heating the sheet before pressing; and
      after pressing the sheet to the mold, a back cover and a hook structure connected to each other are formed of the heated and pressed sheet, wherein the hook structure is bended along the vertical direction to form a groove, and the second core is fixed within the groove; and
   moving the pressed sheet away from the first core along a vertical direction perpendicular to the plane to separate the second core and the first core so as to make the second core become an internal member, wherein the sheet and the internal member form the housing.

2. The method of fabricating the housing of claim 1, wherein the step of providing the sheet comprises:
   heating the sheet to a first predetermined temperature.

3. The method of fabricating the housing of claim 2, wherein the first predetermined temperature is between 300° C. and 500° C.

4. The method of fabricating the housing of claim 2, wherein the step of providing the sheet further comprises:
   heating the mold to a second predetermined temperature, wherein the first predetermined temperature is higher than the second predetermined temperature.

5. The method of fabricating the housing of claim 4, wherein the second predetermined temperature is between 130° C. and 150° C.

6. The method of fabricating the housing of claim 1, wherein the step of providing the sheet comprises:
   applying an adhesive to the sheet to make the second core adhere to the hook structure after the sheet is heated and pressed.

7. The method of fabricating the housing of claim 1, wherein the step of providing the sheet comprises:
   applying an adhesive to the second core to make the second core adhere to the hook structure after the sheet is heated and pressed.

8. The method of fabricating the housing of claim 1, wherein the second core is disposed around the first core, so that the hook structure is connected to an edge of the back cover after the sheet is pressed, and both the groove and the internal member are ring-shaped.

9. The method of fabricating the housing of claim 1, wherein the first core has a top surface, the mold further comprises a third core disposed on the top surface adjacent to an inner edge of the second core, and during the period of pressing the sheet, the back cover and the hook structure are formed by the second core and the third core of the mold.

10. The method of fabricating the housing of claim 9, wherein a dividing line is formed between the second core and the third core, and the step of moving the pressed sheet away from the first core along the vertical direction and separating the second core and the first core to make the second core become the internal member comprises:
    moving the pressed sheet away from the first core along the vertical direction to make the second core fixed with the sheet and the third core connected to the second core away from the first core; and removing the third core along the dividing line to make the second core fixed with the sheet become the internal member.

11. The method of fabricating the housing of claim 9, wherein the material of the first core comprises metal, and the materials of the second core and the third core comprise heat-resistant plastics.

12. The method of fabricating the housing of claim 1, wherein the first core comprises a base portion and a platform portion, the platform portion is located on the base portion, the second core is disposed at an edge of the platform portion, and after pressing the sheet to the mold, the step of making the heated and pressed sheet form the back cover and the hook structure connected to each other further comprises:

after pressing the sheet to the mold, the back cover, the hook structure and a waste portion are formed of the heated and pressed sheet, wherein the hook structure is connected between the back cover and the waste portion, and the waste portion is pressed onto the base portion; and removing the waste portion.

13. The method of fabricating the housing of claim 1, wherein a connecting surface is formed between the first core and the second core in the vertical direction, and the connecting surface is inclined toward the center of the first core along a separating direction of the sheet relative to the mold.

* * * * *